United States Patent

Chou et al.

[11] Patent Number: 6,033,958
[45] Date of Patent: Mar. 7, 2000

[54] METHOD OF FABRICATING DUAL VOLTAGE MOS TRANSISTORS

[75] Inventors: Jih-Wen Chou; Cheng-Han Huang, both of Hsinchu, Taiwan

[73] Assignee: United Microelectronics Corp., Hsin-Chu, Taiwan

[21] Appl. No.: 09/108,107

[22] Filed: Jun. 30, 1998

[30] Foreign Application Priority Data

Apr. 13, 1998 [TW] Taiwan ................. 87105530

[51] Int. Cl.⁷ ................................ H01L 21/8234
[52] U.S. Cl. .................. 438/275; 438/221; 438/225; 438/299
[58] Field of Search .................. 438/199, 275, 438/299, 207, 218, 221, 225

[56] References Cited

U.S. PATENT DOCUMENTS

| | | | |
|---|---|---|---|
| 5,432,114 | 7/1995 | O ................................ | 437/56 |
| 5,502,009 | 3/1996 | Lin . | |
| 5,506,159 | 4/1996 | Enomoto ........................ | 437/43 |
| 5,716,863 | 2/1998 | Arai .............................. | 438/41 |
| 5,888,873 | 3/1999 | Krivokapic ..................... | 438/307 |

*Primary Examiner*—Wael Fahmy
*Assistant Examiner*—Long Pham

[57] ABSTRACT

A method of forming dual voltage MOS transistors includes first forming a mask layer, covering one of the at least two device regions and exposing another one of the two device regions. A gate oxide layer is then formed by thermal oxidation on the exposed device region. After removing the mask layer and exposing another gate oxide formed therebeneath, polysilicon gates for both of the two device regions can be formed.

4 Claims, 4 Drawing Sheets

METHOD OF FABRICATING DUAL VOLTAGE MOS TRANSISTORS

CROSS-REFERENCE TO RELATED APPLICATION

This application claims the priority benefit of Taiwan application serial no. 87105530, filed Apr. 13, 1998, the full disclosure of which is incorporated herein by reference.

BACKGROUND OF THE INVENTION

1. Field of the Invention

The invention relates in general to the fabrication of metal-oxide-semiconductor (MOS) transistors, and more particularly to the fabrication of dual voltage MOS transistors.

2. Description of the Related Art

It is nowadays a tendency to have dual operation voltage for some applications in deep sub-micron regime where the operation voltage of a core device is less than that of a I/O device due to the scaling down of channel length. However, the main obstacle is that the device performance of high and low voltage can not be satisfied simultaneously in current process.

FIG. 1A to FIG. 1E illustrate conventional processes of fabricating a dual voltage NMOS transistor. Referring first to FIG. 1A, the starting material is a lightly doped (~5E14 to 1E16 atoms/cm$^3$) <100> silicon substrate 100. Then, active regions and field regions are desired to be defined. This can be done by selectively oxidizing the field regions 102 so that they are covered with a thick field oxide, using the LOCOS process. Alternatively, shallow trench isolation technique can be applied to define the active regions. The n-well can be fabricated by implanting a n-type dopant into the p-substrate 100, using a photoresist mask (not shown) covering the p-substrate 100 but exposing the predetermined n-well region, and then performing ion implantation.

Referring to FIG. 1B, a first gate oxide layer is grown over the substrate 100. The first gate oxide is then partially etched, usually by HF wet etching, leaving only on the top surface of the substrate 100 desired for a high voltage NMOS (HV NMOS). The HF wet etching process usually causes the damage of oxide in the trenches. This leaving first gate oxide layer is numbered as 104a. Next, another gate oxide formation process is performed to grow an overlaying gate oxide 106, covering the first gate oxide 104a and the exposed top surface of the substrate 100 for the low voltage NMOS (LV NMOS). Therefore, the gate oxide for the HV NMOS is the combination of the first gate oxide layer 104a and the overlaying gate oxide layer 106 and is thus thicker than the gate oxide for the LV NMOS.

Referring to FIG. 1C, a layer of polysilicon of about 0.1~0.3 μm thick, is next deposited by chemical vapor deposition (CVD) over the whole substrate 100. The main technique used to deposit polysilicon is low pressure chemical vapor deposition (LPCVD) because of its uniformity, purity, and economy. The gate structure is then patterned. Following exposure and development of the resist, the polysilicon film is dry-etched, using a photoresist mask (not shown)for protecting the desired regions for forming gates, to form a gate 108 for HV NMOS and another gate 110 for LV NMOS. The gate length of the gate 108 for HV NMOS is usually constructed wider than that of the gate 110 for LV NMOS.

Due to the continuous scaling of channel length, serious hot-carrier effects will cause unacceptable performance degradation. To overcome this problem, an alternative drain structures, lightly doped drains (LDD) is used. Since only NMOS is illustrated in FIG. 1D, only the fabricating processes of NMOS LDD structure are described. Referring to FIG. 1D, to form the NMOS LDD structure, a photoresist mask (not shown) covering the PMOS is first formed. The drains of both the HV NMOS and LV NMOS are then formed at least by two implants. One of these is self-aligned to the gate electrode, and the other is self-aligned to the gate electrode on which two sidewall spacers have been formed.

Referring to FIG. 1D, a first ion implantation process is performed, self-aligned to the gate electrodes 108, 110, penetrating the overlaying gate oxide layer 106 and the first gate oxide layer 104a to form lightly doped sections 112, 114 for both HV NMOS and LV NMOS, respectively. In NMOS devices, the preferred dose is about 1~5E14 atoms/cm$^2$ of phosphorus or arsenic.

Referring to FIG. 1E, a gate sidewall spacer 120 having a thickness of about 0.08~0.10 μm, is formed. The processes of forming the spacer 120 include: first, depositing a dielectric layer over the substrate 100 and etching back. Then, a heavier dose of dopant is implanted to form low resistivity regions 122 of the drain regions of both the HV NMOS and LV NMOS, which are also merged with the lightly doped region. For NMOS devices, this implant is arsenic or phosphorous at a dose of about 1E15 atoms/cm$^2$.

SUMMARY OF THE INVENTION

It is therefore an object of the invention to provide a method of fabricating a dual voltage MOS transistor so that the trench oxide damage can be prevented because the HF wet etching step is not necessary.

A method of forming dual voltage metal-oxide-semiconductor (MOS) transistors is therefore provided. On a substrate, a first device region and a second device region are defined on the substrate by an isolation structure formed thereon. A first oxide layer and a first polysilicon layer are formed successively over the substrate. The first oxide layer and the first polysilicon layer are patterned so that the patterned first oxide layer and the patterned first polysilicon layer remains only on the first device region, and the surface of the substrate on the second device region is therefore exposed. Next, a thermal oxidation process is performed to form a second oxide layer on the surface of the substrate on the second device region. A second polysilicon layer is then formed on the second oxide layer, and the first polysilicon layer and the second polysilicon layer are patterned to form a first polysilicon gate and the second polysilicon gate on the first device region and the second device region, respectively.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
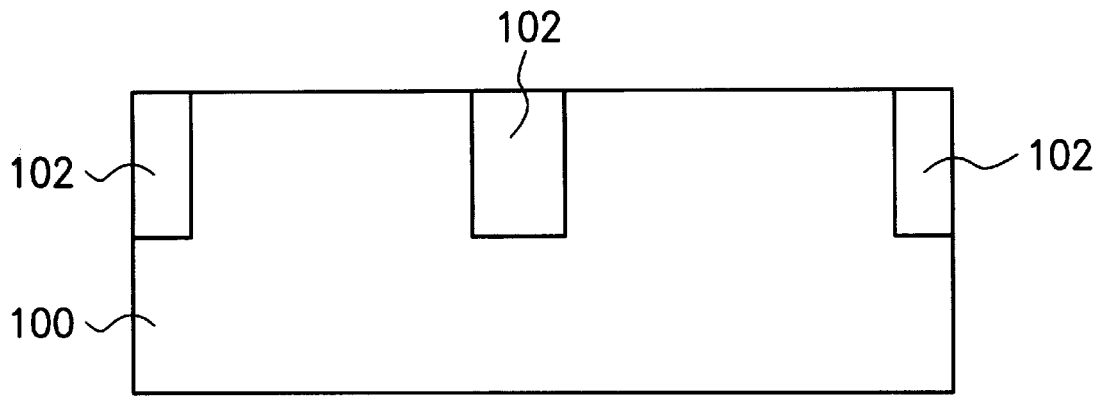
FIG. 1A to 1E are cross-sectional views showing the conventional process steps of fabricating a dual voltage MOS transistors.
Figure 1B:
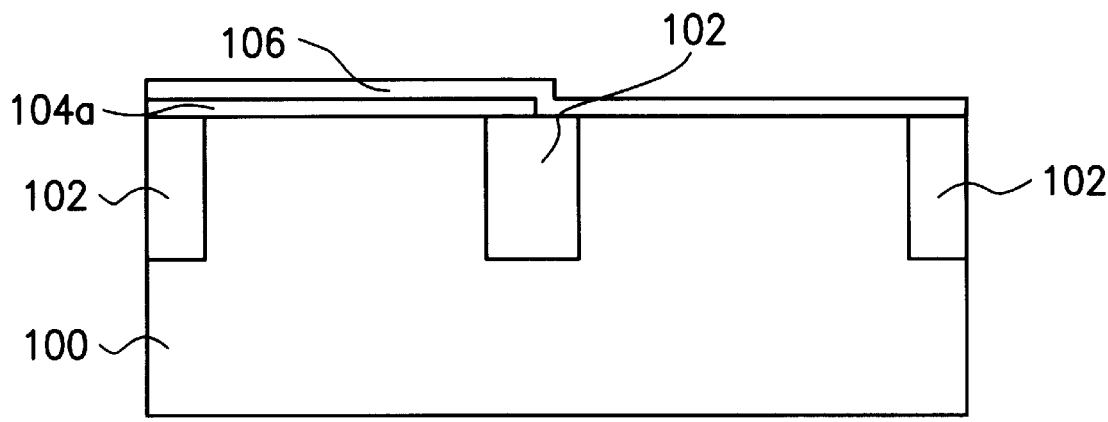
Figure 1C:
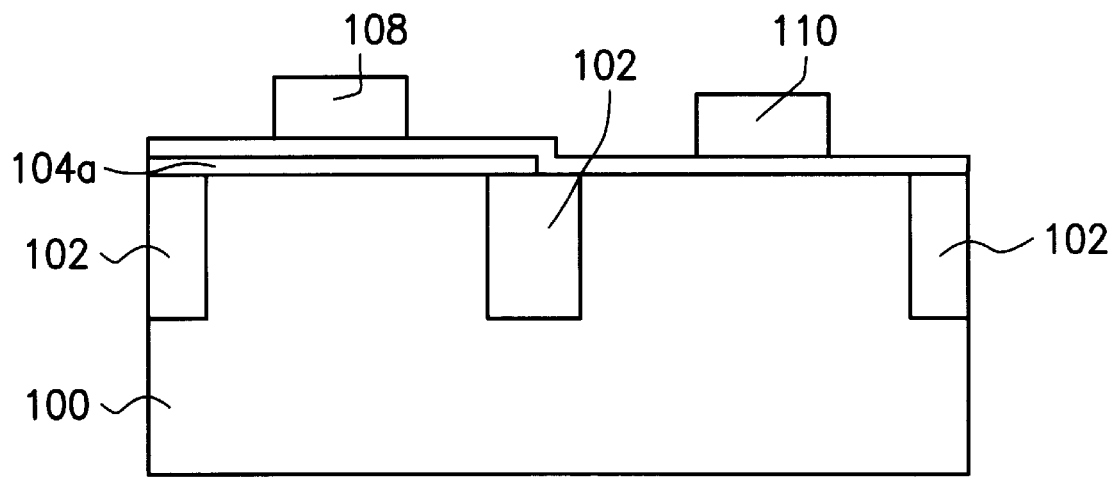
Figure 1D:
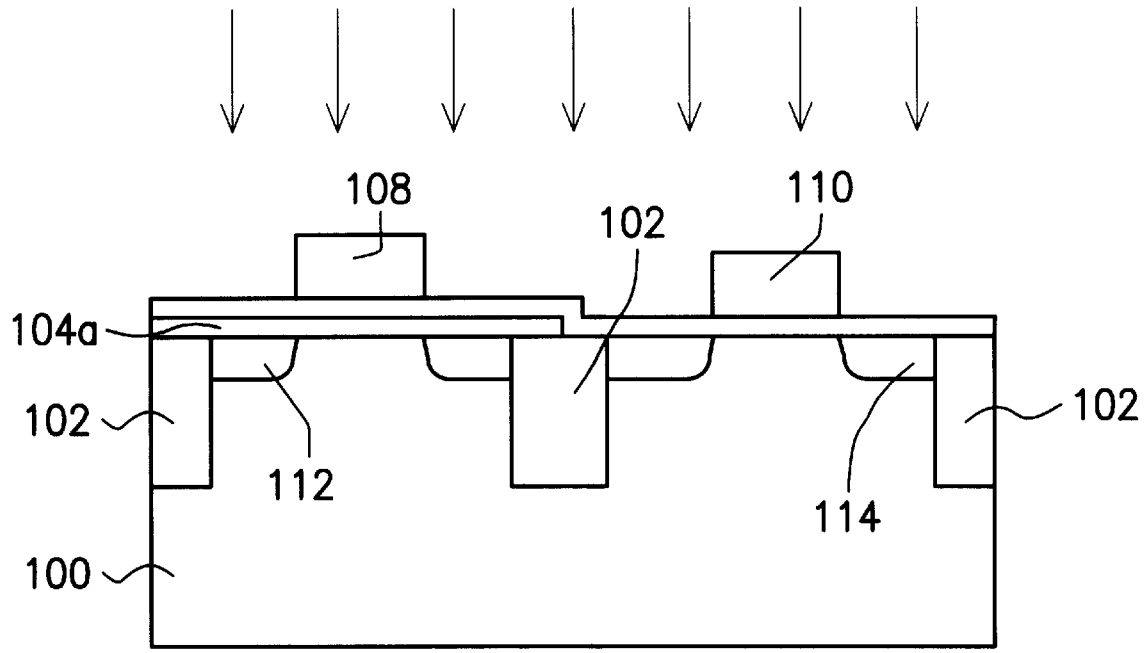
Figure 1E:
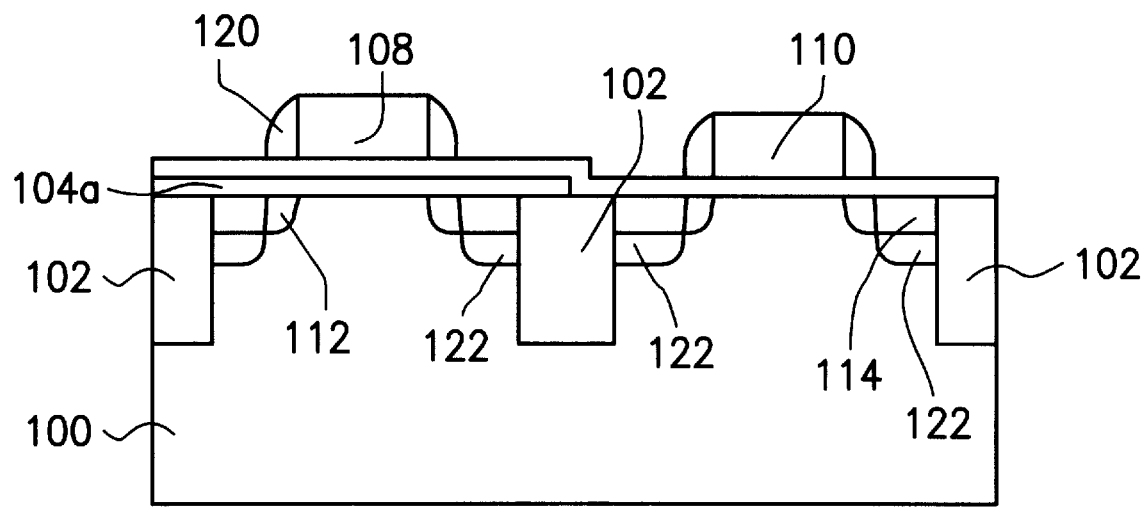
Figure 2A:
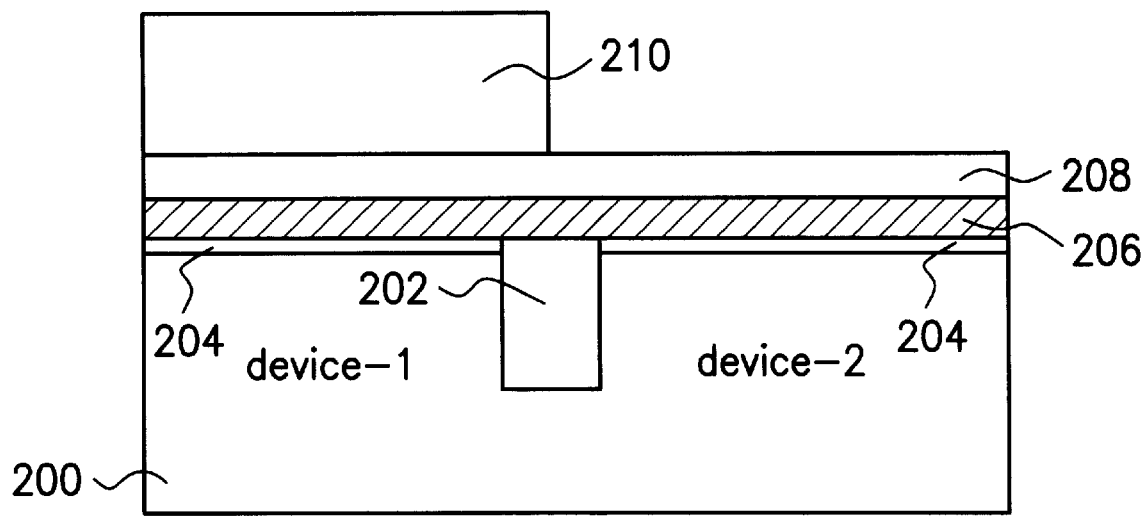
FIG. 2A to 2D are cross-sectional views showing the process steps of fabricating a dual voltage MOS transistors in accordance with a preferred embodiment of the invention.

Referring to FIG. 2A, the starting material is preferably a lightly doped (~5E14 to 1E16 atoms/cm$^3$) <100> silicon substrate 200. Then, active regions and field regions are desired to be defined. This can be done by selectively oxidizing the field regions 202 so that they are covered with a thick field oxide, using the LOCOS process. Alternatively, shallow trench isolation technique can be applied to define the active regions. The active regions formed by the above-mentioned methods include at least the first device region and the second device region. Then, a first oxide layer 204 is formed over the substrate 200, preferably, by thermal oxidation. A polysilicon thin film 206 is next formed on the first oxide layer 204, for example, by chemical vapor deposition. On the polysilicon thin film 206, a silicon nitride layer 208 is preferably deposited, for example, using chemical vapor deposition. A patterned photoresist mask 210 is formed on the silicon nitride layer 208 at the first device region.

Figure 2B:
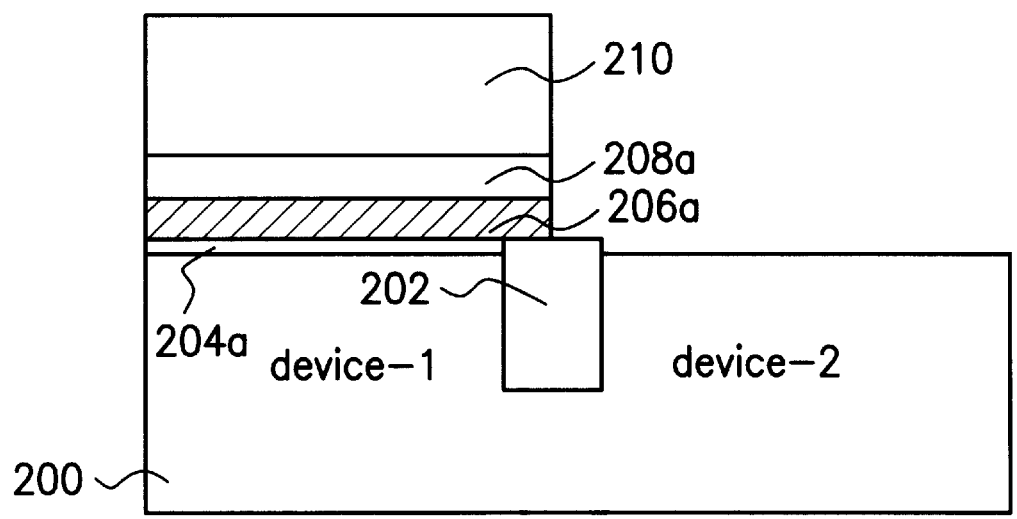

Referring to FIG. 2B, the silicon nitride layer 208, the polysilicon thin film 206 and the first oxide layer 204 are patterned using the patterned photoresist mask 210 as a mask to expose the substrate surface at the second device region. Therefore, the first oxide layer remains at the first device region is represented as a first oxide layer 204a, the polysilicon thin film remains at the first device region is represented as a polysilicon thin film 206a and the silicon nitride layer remains at the first device region is represented as silicon nitride layer 208a.

Figure 2C:
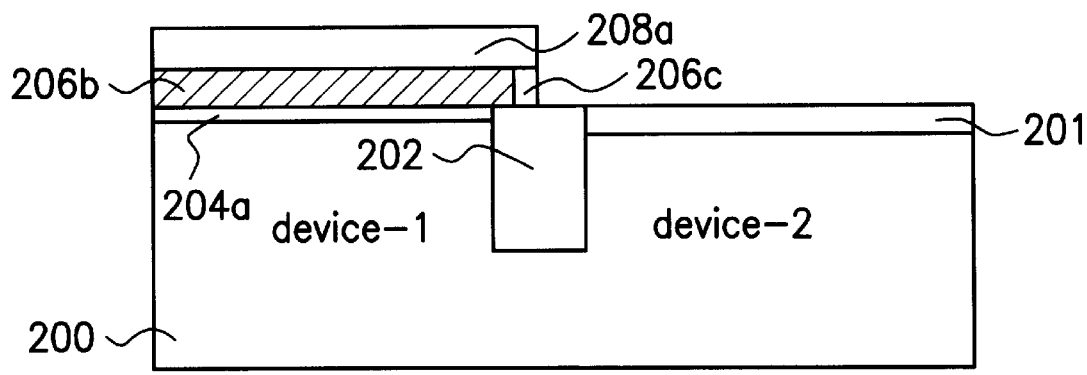

Referring to FIG. 2C, a further oxide layer 201 is formed on the surface of the substrate 200 at the second device region, preferably, by thermal oxidation. The thickness of the oxide layer 201 is depended on the temperature or duration of thermal oxidation. Consequently, the thickness of the oxide layer 201 can be controlled to be either thicker or thinner than the oxide layer 204a. If the oxide layer 201 is thicker than the oxide layer 204a, the second device region where the oxide layer 201 is formed becomes a device region for a high voltage MOS, such as an input/output device region. On the contrary, if the oxide layer 201 is thinner than the oxide layer 204, the second device region where the oxide layer 201 is formed becomes a device region for a lower voltage MOS, such as a core device region.

Figure 2D:
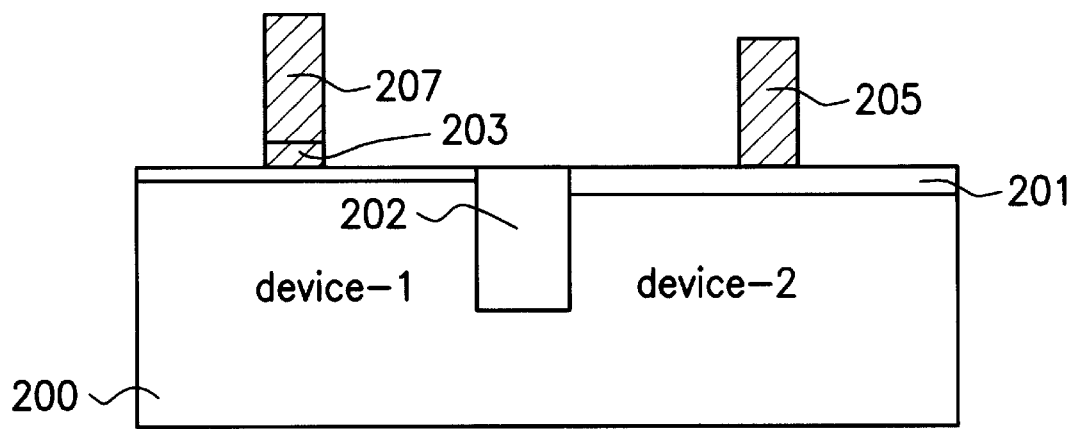

Referring to FIG. 2D, the silicon nitride layer 208a is first removed. A polysilicon layer is then formed over the first device region and the second device region. The polysilicon layer is then patterned, preferably by photolithography and a further etching step, to form at least a polysilicon gate 205 at the second device region. The polysilicon thin film 206b and the polysilicon layer 207 which can be formed thereon are also patterned to form a polysilicon gate at the first device region. The patterning processes of the polysilicon gate on the first device region and the second device region can be accomplished or by a single step or by two separated steps. Moreover, the polysilicon gate on the first device region can include either the combination of both the polysilicon layer 207 and the polysilicon thin film 203 or the polysilicon thin film 203 only.

The continuous processes for accomplishing a dual voltage MOS transistor includes, for example, ion implantation. These continuous processes are not described herein since they are not strongly related to the scope of the present invention. The gate oxide on the first device region is not necessarily thicker or thinner than the gate oxide on the second device region. Whichever is thicker is used as the gate oxide for the input/output circuit and whichever is thinner is used as the gate oxide for the core device. Moreover, the oxide layer 204 can be partially removed without using HF solution so that the field oxide will not be damaged and the kink effect, unstable current and sub-threshold current can be therefore prevented.

While the invention has been described by way of example and in terms of a preferred embodiment, it is to be understood that the invention is not limited thereto. To the contrary, it is intended to cover various modifications and similar arrangements and procedures, such as the formation of a multiple voltage transistor. The scope of the appended claims therefore should be accorded the broadest interpretation so as to encompass all such modifications and similar arrangements and procedures.

What is claimed is:

1. A method of forming dual voltage metal-oxide-semiconductors, comprising the steps of:

providing a substrate having a first device region and a second device region defined by an isolation structure;

forming a first gate oxide layer having a first thickness, a first polysilicon layer, and a silicon nitride layer sequentially on the substrate;

patterning the silicon nitride layer, the first polysilicon layer, and the first gate oxide layer to expose the second device region;

thermally oxidizing a surface of the second device region to form a second gate oxide layer with a second thickness different from the first thickness, wherein the second gate oxide layer is not formed over the first device region;

removing the silicon nitride layer to expose the first polysilicon layer;

forming a second polysilicon layer covering at least the second gate oxide layer;

patterning the first and the second polysilicon layer to form a first gate on the first gate oxide layer and a second gate on the second gate oxide layer; and forming a source/drain region in the first device region and the second device region, respectively.

2. A method of claim 1, wherein the first thickness is larger than the second thickness, so that the first device region is suitable for use for forming a high voltage device and the second device region is suitable for use for forming a low voltage device.

3. A method as claimed in claim 1, wherein the first thickness is smaller than the second thickness, so that the first devic is suitable for use of forming a high voltage device.

4. A method of claim 1, wherein the second polysilicon layer is formed to further cover the first polysilicon layer, so that the first gate comprises a stack of the patterned first polysilicon layer and a part of the patterned second polysilicon layer.

* * * * *